Jan. 15, 1957 D. A. KELLY 2,777,905

LOW DISTORTION AMPLIFIER

Filed Aug. 28, 1952

INVENTOR.
DUNFORD A. KELLY
BY Ernest F. Kelly
Attorney 2,777,905

LOW DISTORTION AMPLIFIER

Dunford A. Kelly, Los Angeles, Calif.

Application August 28, 1952, Serial No. 306,915

4 Claims. (Cl. 179—171)

Figures 1, 2:
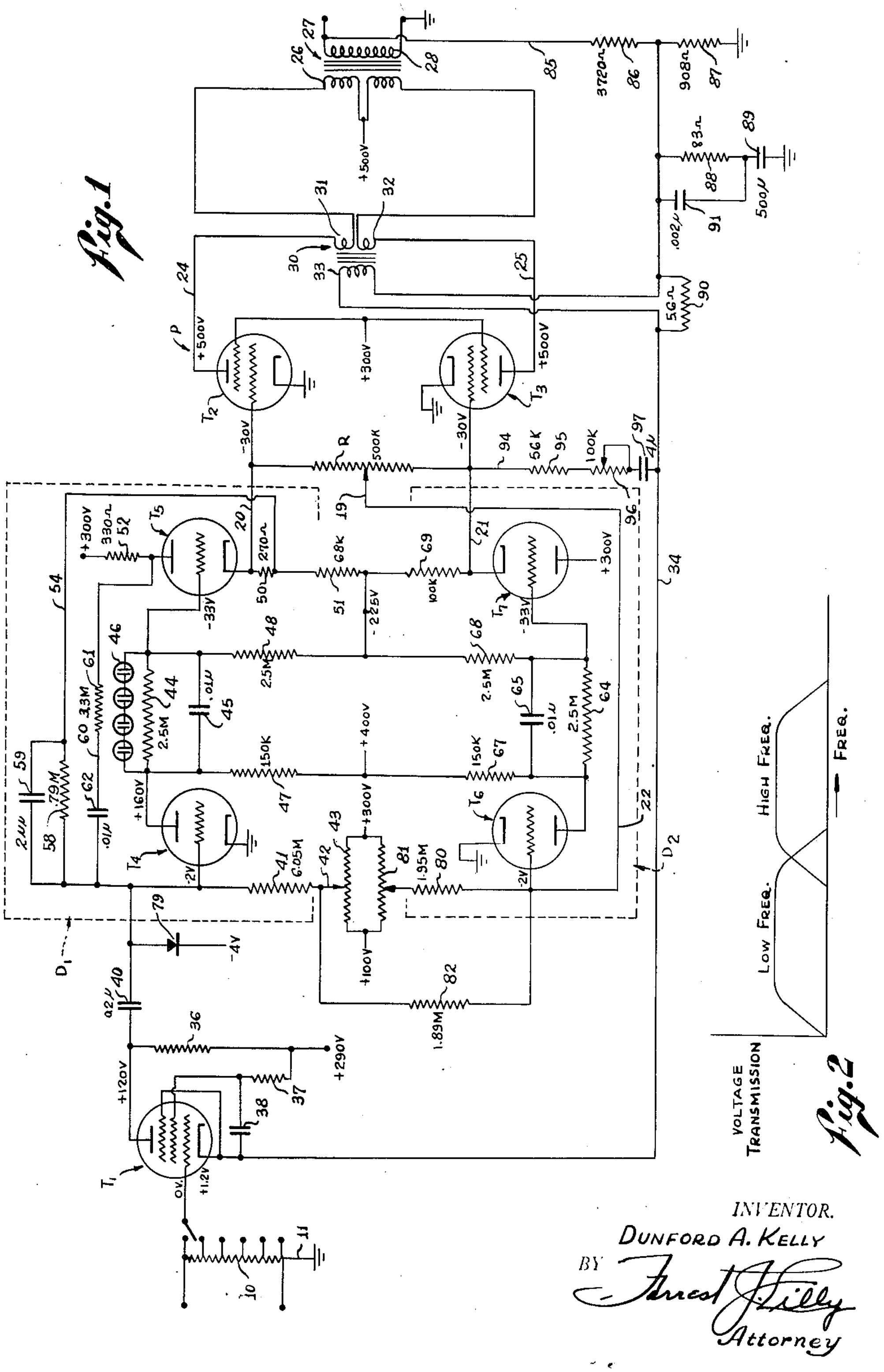

This invention relates generally to audio frequency power amplifiers, and the general object of the invention is the provision of such an amplifier in which distortion is reduced to an extent far greater than has heretofore been realized.

The most linear audio amplifiers available heretofore in the high power range have distortion levels of 1/4 of 1% to 1%. This amount of distortion is, however, still rather substantial, and an object of the present invention is accordingly the provision of an audio frequency power amplifier, having an approximate frequency range of 20 to 20,000 C. P. S., an output of the order of 60 watts, and a distortion level reduced to one or two hundredths of 1% for all harmonics within the audible spectrum.

A further object is the provision of such an amplifier, characterized further by zero output impedance.

A still further object is the provision of an amplifier having low distortion, as well as high overall efficiency. Heretofore, these desirable features have not been realized together, each having been realized only at the expense of the other.

The present invention provides an amplifier which achieves the several relatively extreme objectives mentioned above. It does this through the use of certain unique circuit configurations enabling and providing a very large amount of negative feedback, in combination with a critical degree of positive feedback, resulting in distortion reduction to an unprecedented degree.

The amplifier of the invention is of the class B type, with a large amount of overall negative feedback, of the order of 35 db, obtained by means of an overall negative feedback loop of stabilized transmission characteristics connected from a point in the output circuit beyond the audio frequency output transformer back to the input side of an input amplifier stage. A two stage negative feedback amplifier is employed to drive each grid of the class B amplifier, and each of these drivers comprises a voltage amplifier stage and a cathode follower stage. Each cathode follower by itself has substantial negative feedback and low output impedance, but by combining with it a voltage amplifier stage and a negative feedback loop, the driver output impedance is reduced to such a low value that the voltages applied to the class B grids are essentially pure sine wave, unaltered by the abrupt cyclic variation of grid current.

In the preferred form of the invention, one of the two stage drivers is driven from an input amplifier stage, and the second driver, in order to secure the necessary phase inversion, is driven by the output from the first driver. The use of these two local feedback two-stage amplifiers of extremely low output impedance to drive the grids of the class B amplifier has made it possible to provide a sine wave at those grids with less than 1/10 of 1% distortion.

The input amplifier stage feeds the grid circuit of the two-stage local feedback amplifier that drives the power amplifier stage. The input circuit of this local feedback amplifier is a grid feedback circuit, and the input impedance of the local feedback amplifier is reduced by the feedback factor to a low value. The input stage, which is preferably a tetrode or pentode, is thus working into a very low impedance. The input stage is therefore preferably designed as a low impedance current amplifier. The main advantage of this arrangement is that the circuit impedances are kept lower than when voltage amplification is used, giving better high frequency response.

An amplifier with large overall feedback requires careful control of the transmission characteristics around the main feedback loop, with particular attention being paid to the output transformer, which is apt to have erratic transmission characteristics at frequencies above the audible spectrum, aggravating the feedback stability problem. In the preferred form of the amplifier of the invention, a high frequency transformer is provided which supplies good feedback characteristics for the higher frequency range, e. g., frequencies above about 100 kc., being designed to come into play at the same time that the transmission level of the audio frequency transformer falls away and becomes erratic. This high frequency transformer has, in the preferred arrangement, two primary windings included in series in the two sides of the class B amplifier plate circuit, and its secondary is included in the main negative feedback loop. Feedback transmission characteristics are accordingly held satisfactorily uniform far above the point at which the transmission of the audio transformer becomes erratic.

In addition to the negative feedback loops, positive feedback is introduced into the circuit from the grid circuit of one of the power output stages. This regeneration is adjusted to unity positive feedback factor (incipient oscillation), thereby increasing the gain of the front part of the amplifier to infinity. Theoretically, this regeneration could eliminate all of the distortion originating in the output stage and output transformer. Due to unavoidable phase shifts, and deviation of transmission from exact unity owing to imperfect adjustment or aging of components, this theoretical achievement is of course not fully realized in practice, but additional distortion reduction of the order of 20 db is accomplished.

Additionally, this positive feedback, when adjusted to unity feedback factor, gives the amplifier as a whole an apparent output impedance of zero ohms, and therefore the output voltage is independent of load impedance.

The amplifier of the invention will now be described in more detail with reference to the drawings showing one present illustrative embodiment, in connection with which certain illustrative design constants are given. These are given with the understanding, however, that they are illustrative only, and not limitative on the invention.

In the drawings:

Figure 1 is a circuit diagram of an amplifier in accordance with the invention; and Figure 2 is an idealized representation of the feedback voltage contribution by each transformer in the crossover region.

The amplifying devices of the various stages of the illustrative embodiment of the invention are represented as conventional thermionic electron discharge devices. It is to be understood preliminarily that this showing is illustrative only, and that equivalent amplifying devices, such for example as transistors, may be employed in equivalent circuit configurations without departing from the scope of the invention.

In the illustrative amplifying system shown in Figure 1, the signal voltage from the source is impressed on potentiometer 10, one end of which is grounded, as indicated at 11. The adjustable arm of this potentiometer 11 is connected to the control grid of the first or input amplifier stage $T_1$, which uses preferably a multigrid amplifying device such as a tetrode or pentode, in this instance a 6SH7.

The amplifier has a class B push-pull power stage P, comprised, illustratively, of beam type power amplifiers $T_2$ and $T_3$, in this instance 807's. The control grids of $T_2$ and $T_3$ are driven by two two-stage driver amplifiers $D_1$ and $D_2$, the former driven from the aforementioned input stage $T_1$, and the latter, in the preferred form of the amplifier, from the output of $D_1$. Each driver comprises a voltage amplifier and a cathode follower. Thus the driver $D_1$ for $T_2$ comprises voltage amplifier stage $T_4$ and cathode follower stage $T_5$, and the driver $D_2$ for stage $T_3$ comprises voltage amplifier stage $T_6$ and cathode follower stage $T_7$, all of said stages being preferably triodes. In this instance each driver uses a dual triode, type 12AT7.

The driver $D_1$ is driven from the input stage $T_1$ through a resistor capacitor coupling network, and the driver $D_2$ for the grid of $T_3$ is driven from a tap 19 on a potentiometer R connected between the cathodes of $T_5$ and $T_7$. The cathodes are also connected to the control grids of $T_2$ and $T_3$, thus forming parts of the respective grid circuits for the latter. The tap 19 is connected by loop 22 to the control grid of the input stage $T_6$ of driver $D_2$.

The class B power amplifier has an output circuit including leads 24 and 25 connected to the outside terminals of a center-tapped primary winding 26 of an audio frequency output transformer 27. The center tap of the primary winding is connected to positive 500 volts plate power supply, as indicated. The screen grids of the power amplifier stages $T_2$ and $T_3$ are connected to positive 300 volts.

The transformer 27 has secondary winding 28 leading to the output terminals of the amplifier. A high frequency feedback transformer 30 has two primary windings 31 and 32 included in series in output stage plate circuit leads 24 and 25, and a secondary winding 33 series connected in a later described main or overall negative feedback loop 34. This transformer 30 has substantially uniform transmission from 100 kc. to about 5 mc., and a voltage gain of 2 from either primary to the secondary.

Input stage $T_1$ has plate resistor 36 connected to a positive plate supply voltage of 290 volts, and has a screen grid voltage dropping resistor 37, and by-pass condenser 38. Its plate is coupled to the grid of stage $T_4$ by the conventional type of resistor-capacitor coupling, comprising coupling capacitor 40 and grid resistor 41. The grid resistor 41 is connected at one end to the grid of stage $T_4$, and at its other end to the adjustable arm 42 of a potentiometer 43 permitting a voltage adjustment of +100 to +300 volts.

The plate of stage $T_4$ is resistance coupled to the grid of stage $T_5$ through resistor 44, across which is connected a condenser 45, and also, preferably, a series of glow lamps 46, explained hereinafter. Stage $T_4$ has plate resistor 47, connected to 400 volts positive plate power supply, and stage $T_5$ has grid resistor 48 connected to minus 225 volts.

To the cathode of cathode follower stage $T_5$ is connected a small cathode resistor 50 (e. g., of 270 ohms) to which is in turn connected one end of main cathode resistor 51. The other end of the latter is connected to negative 225 volts power supply. The plate of stage $T_5$ has plate resistor 52 connected to positive 300 volts power supply.

A negative or degenerative voltage feedback loop 54 is connected from the junction point between resistors 50 and 51 to the grid of amplifier stage $T_4$, and this loop includes series voltage dropping resistor 58, around which is preferably shunted a small capacitor 59 for phase shift correction. Also, for a purpose to be later described, a positive current feedback loop 60 is connected from the plate of tube $T_5$ through resistor 61 and blocking capacitor 62 to the grid of stage $T_4$.

The grid of stage $T_4$ is maintained at a grid bias of minus 2 volts, and this minus grid bias voltage is obtained by division of the voltage between the cathode of stage $T_5$ (−30 volts) and the positive voltage source connected to grid resistor 41, the voltage division produced by the drops across resistor 41 and the resistor 58 in loop 54 being such as to establish the desired −2 volts at the grid of $T_4$.

The cathode follower stage $T_5$ can be either resistance-capacitance coupled to $T_4$, in the conventional fashion, or, as shown, resistance coupled, giving the additional benefit that the voltage regulation at the Class B grid is thereby maintained down to zero frequency. It will be noted that in the circuit shown, the negative grid bias applied to stage $T_4$ controls the negative bias on the grid of cathode follower stage $T_5$, and in turn the negative bias on the grid of $T_2$.

An important feature employed in the two-stage driver $D_1$ is a rectifier 79 connected to the grid circuit of stage $T_4$ to stabilize the driver and prevent oscillation. If the negative bias on the tube $T_4$ should increase materially, due to grid rectification in the event of amplifier overload, the A. C. plate resistance will become high, causing plate circuit capacitances to introduce additional phase shift. The stability margin for the feedback loops may thereby be exceeded. If this occurs, the amplifier oscillates. The rectifier 79, connected to minus four volts, is a limiter diode, and prevents the voltage of the grid exceeding minus four volts, thereby preventing the plate resistance from increasing sufficiently to cause oscillation.

Another device for preserving stability of the amplifier when overloaded comprises the glow tubes 46 connected across the coupling resistor 44 between the stages $T_4$ and $T_5$ of the driver $D_1$. The most critical stage from the instability standpoint is the voltage amplifier stage $T_4$. Upon overloading, the A. C. plate resistance of this stage goes to infinity, causing a very large change in the time constant of the anode circuit and the anode capacitance to ground. This causes a large phase shift, sufficient to throw the amplifier into oscillation because of the small stability margin available with large feedback. The problem, then, is to prevent the anode of $T_4$ from going to very high voltages. The cathode follower $T_5$ has a grid which draws a large current as soon as it is driven positive, and it will not go positive more than a volt or two. The normally dark string of glow lamps 46 ionize when the anode voltage at $T_4$ starts to exceed the safe predetermined limiting voltage, and so prevent the anode of $T_4$ from attaining a high voltage with reference to the grid of $T_5$, which is prevented by its grid current from being driven positive. Thus a voltage swing at the anode of $T_4$ such as would induce oscillation in the amplifier is prevented.

The two-stage driver $D_2$ is similar to the driver $D_1$. The voltage amplifier stage $T_6$ has a grid resistor 80 equivalent in function to the grid resistor 41 of driver $D_1$. Potentiometer 43 adjusts the bias of $T_2$ by utilizing the zero frequency amplification of driver $D_1$. Similarly, potentiometer 81 adjusts the bias of $T_3$. To prevent interaction between bias controls 43 and 81, resistor 82 joins the movable contact of potentiometer 43 to the grid of $T_6$. This type of bias adjustment automatically insures that $T_4$, $T_5$, $T_6$, and $T_7$ are properly biased when the biases of $T_2$ and $T_3$ are correctly set.

The plate of stage $T_6$ is preferably coupled to the grid of stage $T_7$ through resistor 64, across which is capacitor 65, although again conventional resistance-capacitance coupling could be employed. Stage $T_6$ has plate resistor 67, connected to the 400 volt positive plate supply, and stage $T_7$ has grid resistor 68 connected to the minus 225 volt supply. A cathode resistor 69 is connected at one end to the cathode of stage $T_7$, and at the other to the corresponding end of cathode resistor 51 of stage $T_5$, and to minus 225 volts power supply. The plate of stage $T_7$ is connected to plus 300 volts power supply. The preferred circuit as shown places the grid bias on $T_3$ under the control of the grid bias on stage $T_6$.

An important feature of the amplifier of the invention is the use of as few coupling capacitors as possible, thereby improving the low frequency stability of the amplifier. The only pure capacitance coupling used transmits the signal from the first stage.

The 180 degree opposed output voltages developed across the cathode resistors of the two cathode followers are impressed across the potentiometer R, and also on the control grids of the power amplifiers $T_2$ and $T_3$. The tap 19 of local feedback loop 22 is connected to potentiometer R at an adjusted point a short distance above its midpoint, so as to pick off a signal voltage of, for example, one volt above the voltage at the midpoint of R. This voltage is of the proper phase so that the output voltage of cathode follower stage $T_7$ will be of the desired 180 degree opposed polarity relative to the output voltage of cathode follower stage $T_5$.

The signal voltage picked off by tap 19 for driving the driver $D_2$ is substantially the voltage drop between the tap and the end of the potentiometer connected to the cathode of $T_7$. The tap 19 also picks off an opposite phase negative feedback voltage for $D_2$ between said tap and the end of the potentiometer connected to the cathode of $T_5$. The loop 22 accordingly simultaneously applies a signal voltage and a negative feedback voltage to the driver $D_2$.

The two-stage driver $D_2$ is designed with sufficient negative feedback to provide the gain of approximately unity required for phase inversion, producing a very low output impedance, of the order of 50 ohms, as is desired for the drive of the class B amplifier. The two-stage driver $D_1$, however, has more voltage gain, to provide satisfactory overall amplification. This results in somewhat greater output impedance than is entirely desirable for the drive of stage $T_2$. Accordingly, I prefer to employ the aforementioned positive feedback loop 60, designed to feed back sufficient voltage to reduce the output impedance of the driver $D_1$ to substantial equality with the output impedance of $D_2$.

The driver $D_1$ has substantial distortion reduction. First, the cathode follower has about 30 db of inherent distortion reduction. The negative voltage feedback loop 54 and positive current feedback loop 60 in combination contribute additionally to the reduction of driver distortion by about 25 db.

Driver $D_2$, by reason of its inherent cathode follower degeneration, has about 30 db of distortion reduction, and the degeneration introduced by loops 22 adds about 25 db of distortion reduction. Further distortion reduction in driver voltage impressed on the power stage results from the overall feedback loop 34, further explained hereinafter.

With the low impedance negative feedback drivers as described, it becomes possible to impress almost pure sine wave signal voltages on the grids of the class B power amplifiers $T_2$ and $T_3$, with a distortion level no greater than $1/10$ of 1% in the present case. It is of course known that a class B amplifier grid presents a load impedance to the driving voltage which varies appreciably over the cycle owing to positive grid current drawn through alternate half-cycles. Such an amplifier can only be driven properly by a driver of low output impedance, and this quality is adequately supplied by the unique combination of the drivers $D_1$ and $D_2$ of the present circuit.

The main feedback loop 34 connects from the ungrounded side of the output transformer secondary 28 to the cathode of input stage $T_1$. This loop includes a series resistor 86, and a resistor 87 is connected between the loop and ground. The cathode current of $T_1$ flowing through these resistors in parallel develops suitable cathode bias voltage for $T_1$, in this instance about 1.2 volts. A shunt feedback resistor 88 is connected between loop 34 and ground, a blocking capacitor 89 being used in series with 88 to prevent D.-C. flow. The resistors 86 and 88 are effectively a voltage divider which determines the main feedback voltage. The capacitor 89 allows resistor 88 to control the feedback voltage without affecting the cathode bias voltage.

The secondary 33 of high frequency transformer 30, preferably with load resistor 90, is connected into the loop 34, and is designed to supply feedback voltage at frequencies above approximately 100 kc. Capacitor 91 across feedback resistor 88 reduces the feedback from the output transformer at the highest frequencies.

The feedback loop 34, designed as described, contributes a negative feedback factor equivalent to 35 db.

The output transformer 27 behaves well as regards transmission level up to nearly or approximately 100 kc., but there suffers a loss in transmission amplitude, and its transmission above 100 kc. is poor and erratic. At about 100 kc., however, the transmission of the high frequency transformer 30 picks up, and transformer 30 takes over the feedback function from the main output transformer. The behavior of the two transformers is illustrated in the transmission amplitude curves of Figure 2, from which it can be seen that proper design of the two transformers permits transmission to be maintained far above the frequency at which the audio transformer becomes poor.

The amplifier as so far described is capable of very great distortion reduction, the distortion level, with good tubes, being of the order of $1/10$ of 1%. It has about 2% voltage regulation.

However, by addition of a positive feedback loop from the grid of one of the power tubes to the cathode of the input tube, distortion is further reduced by a large additional amount, and output impedance is reduced to zero. This loop is formed by a conductor 94 connected to the grid circuit for power tube $T_3$, and connected through resistor 95, variable resistor 96, and blocking condenser 97, to the loop 34, which completes the positive feedback connection to the cathode of tube $T_1$. This positive feedback loop is adjusted to unity positive feedback factor, giving the amplifier a theoretical gain of infinity. This regeneration greatly reduces distortion, in practice, in an amount of the order of 20 db. At the same time, the positive unity feedback factor reduces the output impedance of the amplifier to zero.

The effect of positive feedback may be understood from the following. It is assumed first that the amplifier has a negative feedback loop from the output terminal to the input terminal. Now, if the gain of the amplifier should be increased, the negative feedback will be increased. The positive feedback loop, adjusted to unity feedback factor, increases the gain of the amplifier to infinity. Infinite gain together with overall voltage degeneration also denotes zero apparent output impedance, and therefore zero voltage regulation. With the last described positive feedback loop, therefore, the output impedance of the amplifier is zero.

Each cathode follower has an inherent feedback of about 30 db. The local feedback loops around the two-stage driver amplifiers contribute another 20–30 db. The main feedback loop 34 contributes about 35 db of negative feedback. In total, the cathode followers have a feedback factor of around 90 db. The output stage has approximately 55 db of distortion reduction. Other portions of the circuit have various amounts, but there is considerably more feedback throughout than the 35 db contributed by the main loop alone.

The amplifier, complete with the positive feedback loop, produces 60 watts of audio power at any frequency from 20 to 20,000 cycles at a distortion level of about one or two hundredths of 1% for all harmonics within the audible spectrum. At frequencies above the audio spectrum the distortion would increase somewhat.

In describing the illustrative embodiment, various specific circuit configurations and circuit constants have been given, but it will be understood that these are merely illustrative, and that various changes and modifications may be made without departing from the scope of the broad invention. It should also be noted that whereas the present amplifier has been described primarily as of the class B type, the circuit will also operate, with suitable changes in design constants, as a class A type, though of course with reduced output. The invention is therefore not to be considered as limited to a class B type amplifier.

I claim:

1. In an amplifier, the combination of: a power amplifying stage comprising two amplifying devices operating in push-pull, a low frequency output transformer, a high frequency feedback transformer, the outputs of said amplifying devices being connected together through the primary windings of said high frequency and low frequency transformers, respectively, in series, negative feedback driver amplifier means for said power amplifying means, an input amplifier stage connected to said driver amplifier means, a degenerative feedback loop connected from the secondary winding of said low frequency transformer to said input stage and including in series the secondary winding of said high frequency transformer, whereby said degenerative feedback is effective over both low and high frequency ranges.

2. In an amplifier, the combination of: a power amplifier stage having power amplifying devices connected in push-pull, an output circuit for said power stage including an audio frequency output transformer having primary and secondary windings and a high frequency feedback transformer having primary and secondary windings, negative feedback driver amplifier means for said power amplifier, an input amplifier stage feeding said negative feedback driver amplifier, and an overall negative feedback loop from one side of the secondary winding of said audio frequency transformer to the input of said input amplifier stage, said feedback loop including the secondary winding of said high frequency transformer.

3. The subject matter of claim 2, wherein said output circuit for said push-pull power amplifier stage includes conductors leading from the push-pull amplifying devices to the primary winding of said audio frequency transformer, and wherein said high frequency transformer has two primary windings, each series connected in one of said conductors.

4. The subject matter of claim 2, including also a positive feedback loop connected from a point between the driver amplifier means and the power amplifier stage, to the input of the input amplifier stage.

References Cited in the file of this patent

UNITED STATES PATENTS

| | | |
|---|---|---|
| 1,985,352 | Numans | Dec. 25, 1934 |
| 2,120,823 | White | June 15, 1938 |
| 2,153,756 | Hunt | Apr. 11, 1939 |
| 2,386,892 | Hadfield | Oct. 16, 1945 |
| 2,542,160 | Stoner | Feb. 20, 1951 |
| 2,581,953 | Hecht et al. | Jan. 8, 1952 |
| 2,624,796 | Saunders | Jan. 6, 1953 |

FOREIGN PATENTS

| | | |
|---|---|---|
| 453,574 | Great Britain | Sept. 14, 1936 |
| 107,664 | Australia | Jan. 27, 1939 |
| 515,158 | Great Britain | Nov. 28, 1939 |

OTHER REFERENCES

Childs article, Radio and Television News, July 1951, pages 37–40.